(12) United States Patent
Mitsuhashi

(10) Patent No.: US 9,198,313 B2
(45) Date of Patent: Nov. 24, 2015

(54) DISPLAY DEVICE

(75) Inventor: Renichi Mitsuhashi, Tokyo (JP)

(73) Assignee: NEC DISPLAY SOLUTIONS, LTD., Tokyo (JP)

( * ) Notice: Subject to any disclaimer, the term of this patent is extended or adjusted under 35 U.S.C. 154(b) by 98 days.

(21) Appl. No.: 13/985,240

(22) PCT Filed: Apr. 14, 2011

(86) PCT No.: PCT/JP2011/059284
§ 371 (c)(1),
(2), (4) Date: Aug. 13, 2013

(87) PCT Pub. No.: WO2012/140767
PCT Pub. Date: Oct. 18, 2012

(65) Prior Publication Data
US 2013/0314864 A1    Nov. 28, 2013

(51) Int. Cl.
*H05K 5/02*    (2006.01)
*H05K 5/00*    (2006.01)
(Continued)

(52) U.S. Cl.
CPC .......... *H05K 5/023* (2013.01); *G02F 1/133308* (2013.01); *G06F 1/1601* (2013.01); *H05K 5/0017* (2013.01); *G02F 2201/46* (2013.01); *H04N 5/64* (2013.01)

(58) Field of Classification Search
CPC ..... F16M 13/02; F16M 11/04; F16M 11/041; F16M 11/00; F16M 11/12; F16M 11/2085; F16M 11/26; F16M 11/08; F16M 11/2014; F16M 11/2064; F16M 11/24; F16M 2200/044; G06F 1/1601; G06F 2200/1612; G06F 1/1624; A47B 81/061; A47B 96/06

USPC ................ 361/807, 679.59; 248/917, 220.22; 348/794
See application file for complete search history.

(56) References Cited

U.S. PATENT DOCUMENTS

2009/0127423 A1    5/2009  Chen et al.
2010/0301717 A1*   12/2010 Wang .......................... 312/223.1
(Continued)

FOREIGN PATENT DOCUMENTS

CN    101056513 A    10/2007
CN    101192454 A    6/2008
(Continued)

OTHER PUBLICATIONS

International Search Report dated May 24, 2011 with English translation thereof.

(Continued)

*Primary Examiner* — Hung S Bui
*Assistant Examiner* — Michael Matey
(74) *Attorney, Agent, or Firm* — McGinn IP Law Group PLLC

(57) ABSTRACT

A display device includes: a display unit that displays an image; and a handle provided on a back surface of the display unit. The handle includes: a handle body that is manually grasped; and a fixing part that is detachably fixed to a back surface of the display unit. The fixing part includes: a first fixing mechanism that fixes the handle in a state in which the handle body protrudes outward in a depth direction from the back surface of the display unit, and a gap between the handle body and the display unit in the depth direction is enlarged; and a second fixing mechanism that fixes the handle in a state in which the gap between the handle body and the display unit in the depth direction is reduced relative to a state of the handle being fixed using the first fixing mechanism.

17 Claims, 6 Drawing Sheets

(51) Int. Cl.
*G06F 1/16* (2006.01)
*G02F 1/1333* (2006.01)
*H04N 5/64* (2006.01)

(56) References Cited

U.S. PATENT DOCUMENTS

| | | | | |
|---|---|---|---|---|
| 2011/0308979 A1* | 12/2011 | Mitsuhashi | | 206/320 |
| 2011/0315837 A1* | 12/2011 | Mitsuhashi | | 248/201 |
| 2011/0317345 A1* | 12/2011 | Huang et al. | | 361/679.01 |
| 2012/0320514 A1* | 12/2012 | Franz et al. | | 361/679.26 |

FOREIGN PATENT DOCUMENTS

| | | |
|---|---|---|
| CN | 201111947 Y | 9/2008 |
| JP | 1-273086 A | 10/1989 |
| JP | 2005-265954 A | 9/2005 |
| JP | 2005-266396 A | 9/2005 |
| JP | 2006-308062 A | 11/2006 |

OTHER PUBLICATIONS

Chinese Office Action dated Feb. 27, 2015 with an English Translation thereof.

* cited by examiner

DISPLAY DEVICE

TECHNICAL FIELD

The present invention relates to a display device such as a liquid crystal display, a plasma display, or the like.

BACKGROUND ART

Heretofore, a display device A such as a liquid crystal display or a plasma display as shown for example in FIG. 7, is constituted by including a display unit 2 formed in a rectangular board shape, with peripheral surfaces and a back surface of a display panel covered with a frame case 1. Furthermore, especially in a large size display device A for business, which is larger than 46 inches or more, such as a display device (business use monitor) for rental or high elevation installation, a handle 3 is installed on the back surface 2a side of the display unit 2, and by an operator or a user grasping this handle 3, the operations of transporting and installing it are simplified (for example, refer to Patent Document 1).

PRIOR ART DOCUMENT

Patent Document

[Patent Document 1] Japanese Unexamined Patent Application, First Publication No. 2005-266396

SUMMARY OF THE INVENTION

Problem to be Solved by the Invention

On the other hand, it is planned that a display device A such as a liquid crystal device or a plasma display will be made thinner in the future. If the display device A is made thinner, a handle 3 which is formed at a certain size to ensure that an operator or a user can grasp it easily, protrudes outward in the depth direction T1 from a back surface 2a.

Therefore, for example, in the case where the display device A is installed on a wall, or display devices A are installed with their back surfaces facing each other, the location of the display device A must be shifted by the amount that the handle 3 protrudes from the back surface 2a. As a result, even though the display device A is made thinner, the display device A is installed in a state in which it stands off considerably from the wall, or a large gap occurs between the display devices A installed with their back surfaces facing each other.

It can also be considered that the handle 3 is installed on a side part 2b of the display unit 2 of the display device A such that it protrudes outward in a widthwise direction T2 of the display device A so as to avoid protruding outward in the depth direction T1 from the back surface 2a. However, in this case, since the handle 3 is exposed in a state in which the display device A is installed on a wall or the like, it degrades the design.

Means for Solving the Problem

In order to solve the above-described problems, this invention provides the following measures.

A display device of the present invention includes: a display unit that displays an image; and a handle provided on a back surface of the display unit, the handle is formed by including: a handle body that is manually grasped; and a fixing part that is detachably fixed to a back surface side of the display unit, the fixing part includes: a first fixing mechanism that fixes the handle in a state in which the handle body protrudes outward in a depth direction from the back surface of the display unit, and a gap between the handle body and the display unit in the depth direction is enlarged; and a second fixing mechanism that fixes the handle in a state in which the gap between the handle body and the display unit in the depth direction is reduced relative to a state of being fixed using the first fixing mechanism.

In this invention, when the fixing part is fixed to the display unit using the first fixing mechanism, the handle can be attached to the display unit in a state in which the handle body that an operator or a user grasps manually when the display device is transported and installed, protrudes outward in the depth direction from the back surface of the display unit, and the gap between the handle body and display unit is enlarged. Moreover, when the fixing part is fixed to the display unit using the second fixing mechanism, the handle can be attached to the display unit in a state in which the gap between the handle body and the display unit is reduced. That is, using the first fixing mechanism and the second fixing mechanism, the location of the handle body and the size of the gap between the handle body and the display unit can be adjusted selectively.

Furthermore, it is preferable that in the display device of the present invention, the first fixing mechanism includes: a first contact surface that makes surface contact with the display unit, and locates the handle in a state in which the gap is enlarged; a first through hole that opens to the first contact surface; and a fixing member that is inserted into the first through hole, the fixing member fixing the fixing part to the display unit while causing the first contact surface making surface contact, and the second fixing mechanism includes: a second contact surface that is formed intersecting with the first contact surface at a predetermined angle, the second contacting surface making surface contact with the display unit, the second contact surface locating the handle in a state in which the gap is reduced; a second through hole that opens to the second contact surface; and a fixing member that is inserted into the second through hole, the fixing member fixing the fixing part to the display unit while causing the second contact surface making surface contact.

In this invention, by inserting a fixing member such as a screw into the first through hole and fixing the fixing part to the display unit, the first contact surface makes surface contact with the display unit, so that the handle can be located and fixed reliably using the first fixing mechanism in a state in which the gap is enlarged. Furthermore, by inserting a fixing member into the second through hole and fixing the fixing part to the display unit, the second contact surface makes surface contact with the display unit, so that the handle can be located and fixed reliably using the second fixing mechanism in a state in which the gap is reduced.

Moreover, it is preferable that in the display device of the present invention, the first through hole and the second through hole are formed such that their axes are parallel to each other, and are perpendicular to the first contact surface or the second contact surface, and one of the through holes which opens to one of the contact surfaces that is not perpendicular to the axes, is formed as an elongated hole.

In this invention, in a state in which the first contact surface or the second contact surface makes surface contact with the display unit, by the engaging bump provided on the first contact surface or the second contact surface being engaged in the engaging indentation in the display unit, it is possible to locate and fix the handle reliably in a state in which the gap is enlarged using the first fixing mechanism, or in a state in which the gap is reduced using the second fixing mechanism.

Moreover it is further preferable that in the display device of the present invention, the first through hole and the second through hole are formed such that their axes are parallel to each other, and are perpendicular to the first contact surface or the second contact surface, and one of the through holes which opens to one of the contact surfaces that is not perpendicular to the axes, is faulted as an elongated hole.

In this invention, the first through hole and the second through hole are formed such that their axes are parallel to each other, and are perpendicular to the first contact surface or the second contact surface. Furthermore, one of the through holes which opens to one of the contact surfaces that is not perpendicular to the axes, is formed as an elongated hole. If constructed in this manner, when the fixing part is fixed to the display unit while one of the contact surfaces makes surface contact with the display unit, it is possible to create a state in which the central axis of a fixing member inserted into the through hole that has an elongated hole does not coincide with the axis of the one of the through holes, so that the fixing part can be fixed to the display unit in a state in which the central axis of the fixing member is perpendicular to the one of the contact surfaces. As a result, it is possible to fix the fixing part to the display unit by the fixing member with the one of the contact surfaces making reliable and firm surface contact with the display unit.

Moreover, if the first through hole and the second through hole are provided with their axes parallel to each other, then when forming the handle using an injection molding process or a casting method, a protrusion of a metal mold for forming the first through hole and a protrusion of a metal mold for forming the second through hole protrude in the same direction. Therefore, by providing the protrusions in a single metal mold, and withdrawing the metal mold in one direction of the axis of the first through hole and the second through hole when demolding, the first through hole and the second through hole can be formed at the same time. As a result, it is possible to manufacture a handle efficiently, and reduce the cost of the metal mold, enabling the manufacturing cost of the handle to be reduced.

Effect of the Invention

In a display device of the present invention, it is possible to adjust the location of the handle body and the size of the gap between the handle body and the display unit selectively using the first fixing mechanism and the second fixing mechanism.

Therefore, for example when transporting the display device, by fixing the handle to the display unit using the first fixing mechanism, an operator or a user can manually grasp the handle body firmly.

Furthermore, when installing the display device on a wall, or when installing display devices with their back surfaces facing each other, by fixing the handle to the display unit using the second fixing mechanism, the handle body does not protrude outward in the depth direction from the back surface of the display unit, so that it is not necessary to shift the location of the display device due to the handle protruding from the back surface as is done conventionally. As a result, it is possible to solve inconveniences such as installing the display device in a state in which it stands off considerably from a wall, or creating a large gap between display devices installed with their back surfaces facing each other even though the display device is made thinner. Furthermore, when installing the display device on a wall, or installing display devices with their back surfaces facing each other in this manner, by using the second fixing mechanism it is possible to ensure that there is a small gap for an operator or user to hook his or her fingers between the handle body and the display unit, so he or she can transport or install the display device in a stable state with his or her fingers hooked in the handle.

EMBODIMENTS FOR CARRYING OUT THE INVENTION

Hereunder is a description of a display device according to an exemplary embodiment of the present invention, with reference to FIG. 1 to FIG. 6.

A display device B of the present exemplary embodiment is for example a display device (business use monitor) for rental or high elevation installation, and is a large size business use display device of 46 inches or more, which is installed on a wall for use (or display devices are installed with their back surfaces facing each other).

Figure 1:
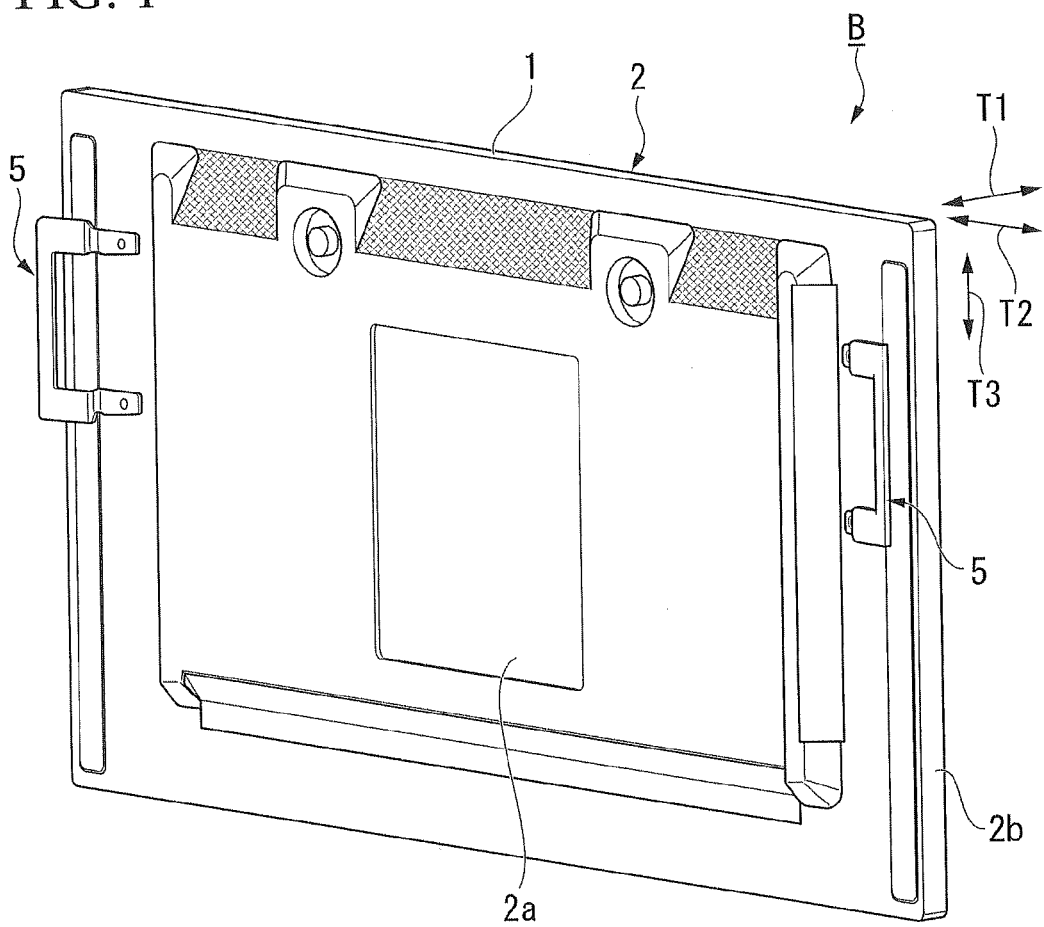
FIG. 1 is a perspective view showing a display device according to an exemplary embodiment of the present invention.

This display device B, as shown in FIG. 1, includes a rectangular board shape display unit 2 that displays images, and a plurality of handles 5 which are installed on a back surface 2a side of the display unit 2 so as to make it easy for an operator or a user to transport and install the display device B with it hooked on his or her hand.

The display unit 2 is constituted by including a display panel such as a liquid crystal display panel or a plasma display panel, and an integrated frame case 1 which covers the peripheral surfaces and the back surface of the display panel.

The handles 5 are made of a metal such as aluminum alloy, or of resin, and are formed using a processing method such as casting, injection molding or the like. Furthermore, in the display device B of the present exemplary embodiment, two handles 5 are attached to the two side portion sides of the display unit 2 in the widthwise direction T2. The number and the location of the handles 5 attached to the display device B may not be specifically limited to the present exemplary embodiment.

Figure 2:
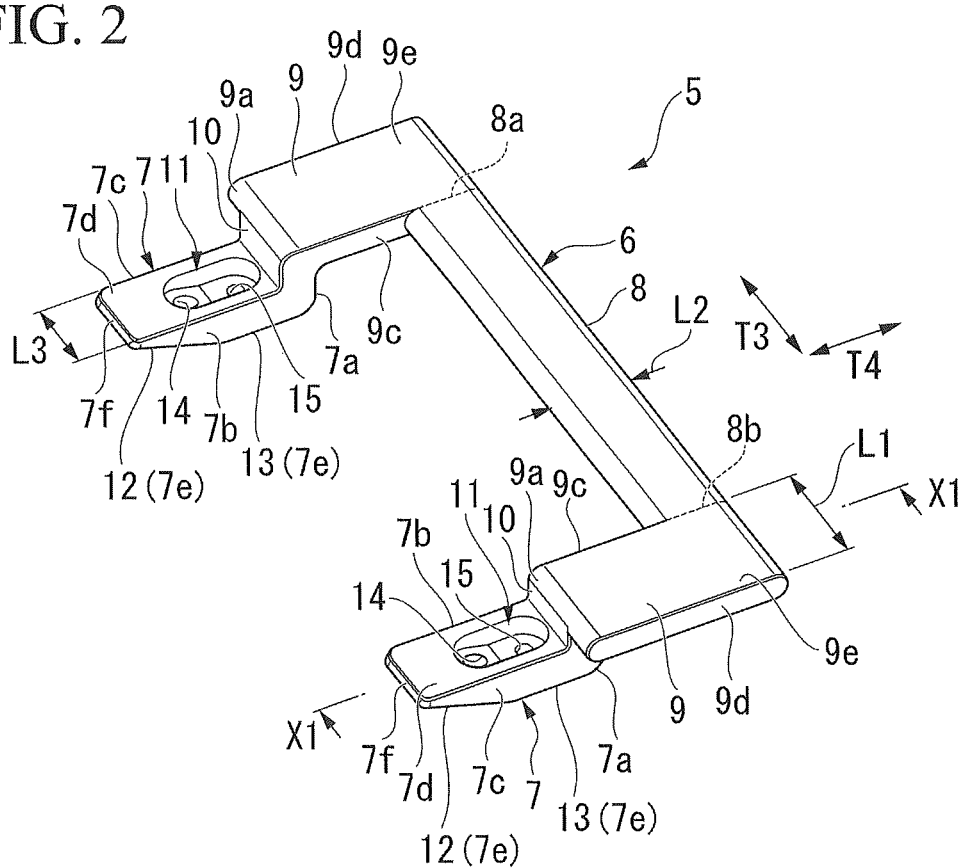
FIG. 2 is a perspective view showing a handle of the display device according to the exemplary embodiment of the present invention.
Figure 3:
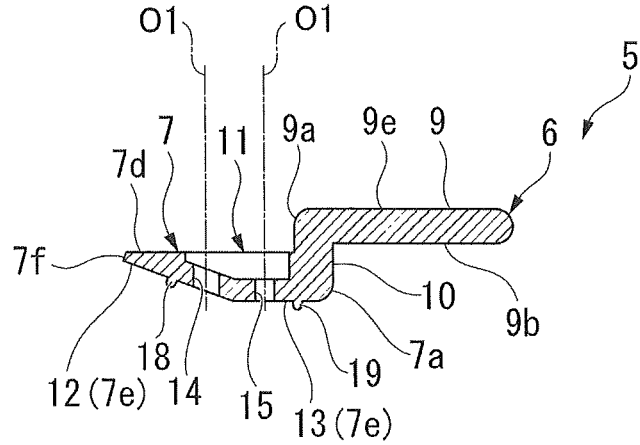
FIG. 3 is a view along X1-X1 line of FIG. 2, being a cross-sectional diagram showing the handle of the display device according to the exemplary embodiment of the present invention.

On the other hand, the handles 5 of the present exemplary embodiment, as shown in FIG. 1, FIG. 2, and FIG. 3, is formed by including a handle body 6 which an operator or a user manually grasps, and a fixing part 7 for detachably fixing onto the back surface 2a side of the display unit 2.

As shown in FIG. 2, the handle body 6 is formed in a U shape, and includes a grip part 8 which extends in a vertical direction T3 and an operator or a user manually grasps, and finger hold parts 9 which extend from an upper end 8a and a lower end 8b of the grip part 8 in a horizontal direction T4, and on which the operator or the user hooks his or her fingers. Moreover, in the present exemplary embodiment, the finger hold parts 9 are formed such that a width dimension L1 in the vertical direction T3 is larger than a width dimension L2 of the grip part 9 in the horizontal direction T4.

Fixing parts 7, as shown in FIG. 2 and FIG. 3, extend in the horizontal direction T4 with their proximal ends 7a joined to the distal end 9a sides of each of the finger hold parts 9 that extend from the upper end 8a and the lower end 8b of the grip part 8 in the horizontal direction T4. Furthermore, each of the fixing parts 7 is joined to the finger hold part 9 via a step part 10 that bends at approximately a right angle from the distal end 9a of the finger hold part 9 toward the back surface 9b side. Moreover, the fixing part 7 is formed such that its width dimension L3 in the vertical direction T3 is smaller than the width dimension L1 of the finger hold part 9, and is joined to the finger hold part 9 such that one side part 7b is matched with the position of the side part 9c on the inner side of the finger hold part 9 in the vertical direction T3. By so doing, the handle 5 is formed such that the side part 9d side of the outer side of the finger hold part 9 protrudes beyond the other side part 7c of the fixing part 7 in the vertical direction T4.

Furthermore, the fixing part 7 of the present exemplary embodiment is formed such that the top surface 7d extends along the top surface 9e of the finger hold part 9 in the horizontal direction T4, and an indented part 11 is provided that is indented from the top surface 7d toward the back surface 7e side. Moreover, the fixing part 7 is formed such that the back surface 7e has a first contact surface 12 and a second contact surface 13. The second contact surface 13 extends in the horizontal direction T4 along the back surface 9b of the finger hold part 9 from the proximal end 7a joined to the finger hold part 9 via the step part 10, and is formed at the part from the proximal end 7a of the fixing part 7 to its approximate center in the extending direction. The first contact surface 12 is joined to the second contact surface 13, is formed on the distal end 7f side of the fixing part 7, and is formed such that it is inclined with respect to the second contact surface 13 at a predetermined angle so as to approach the top surface 7d gradually toward the distal end 7f side from the proximal end 7a side of the fixing part 7 (in other words, the second contact surface 13 is formed such that it intersects the first contact surface 12 at a predetermined angle).

Furthermore, the fixing part 7 is formed by including a first through hole 14 that opens to the first contact surface 12 and passes through to the back surface 7e from the top surface 7d side of the fixing part 7, and a second through hole 15 that opens to the second contact surface 13 and passes through to the back surface 7e from the top surface 7d side of the fixing part 7. At this time, the first through hole 14 and the second through hole 15 have their axes O1 parallel to each other, are formed perpendicular to the second contact surface 13, and open to the base of the indented part 11. Moreover, in the present exemplary embodiment, the second through hole 15 that opens to the second contact surface 13 that is perpendicular to the axis O1, is formed as a circular hole, and the first through hole (one of the through holes) 14 that opens to the first contact surface (one of the contact surfaces) 12 that is not perpendicular to the axis O1, is formed as an elongated hole.

Furthermore, the fixing part 7 of the present exemplary embodiment, as shown in FIG. 3, FIG. 4(b), and FIG. 5(b), is provided with engaging bumps 18 and 19 on the first contact surface 12 and second contact surface 13 respectively, for engaging with engaging indentations 16 or 17 formed in the display unit 2, and locating the fixing part 7, in a state in which the first contact surface 12 or the second contact surface 13 makes surface contact with the display unit 2.

Figure 4:
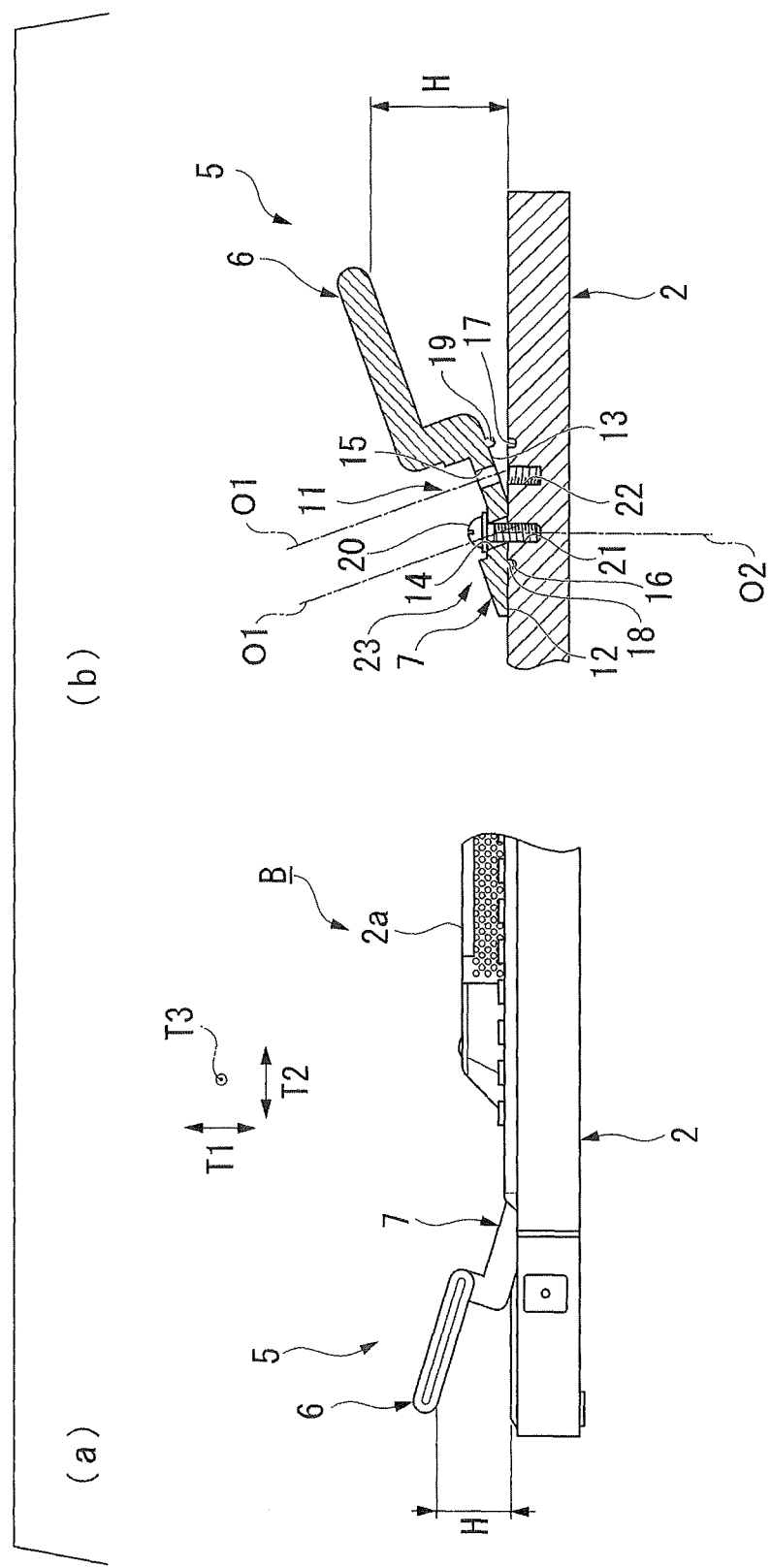
FIG. 4 is a diagram showing a state in which the handle is attached using a first fixing mechanism.
Figure 5:
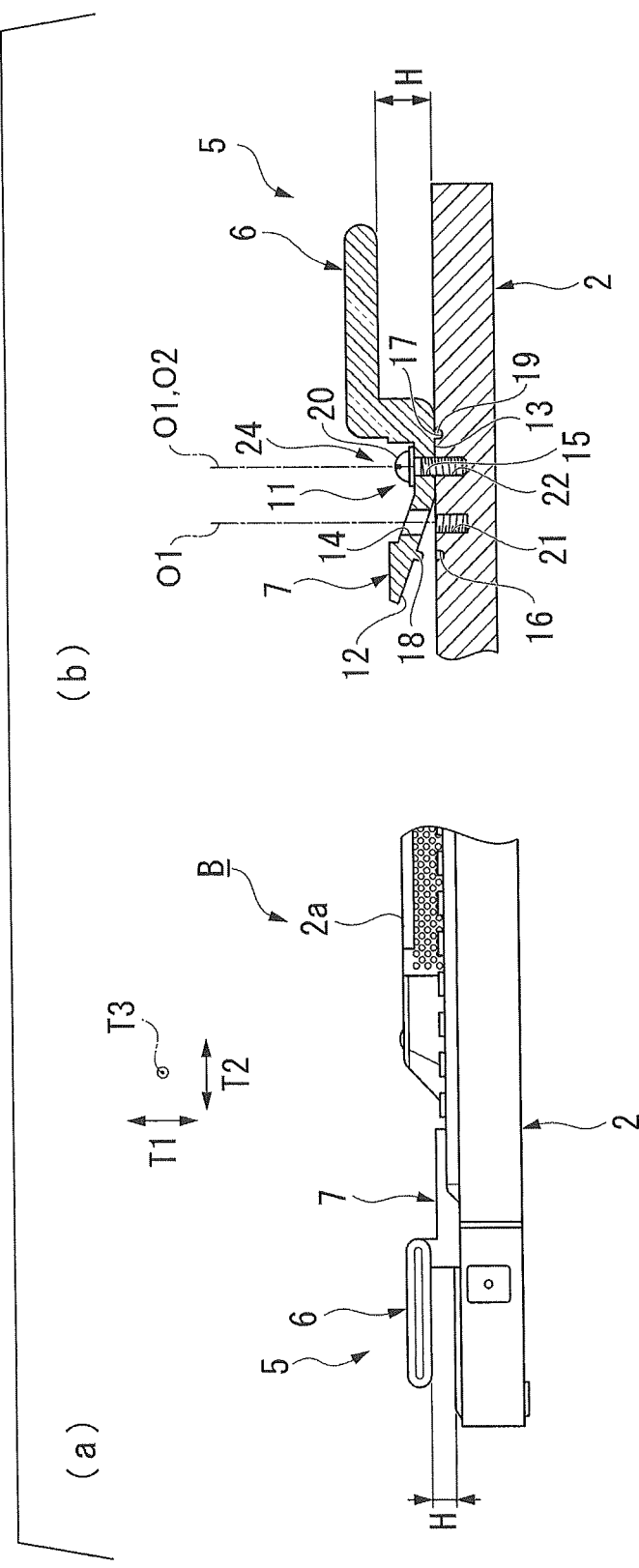
FIG. 5 is a diagram showing a state in which the handle is attached using a second fixing mechanism.
Figure 6:
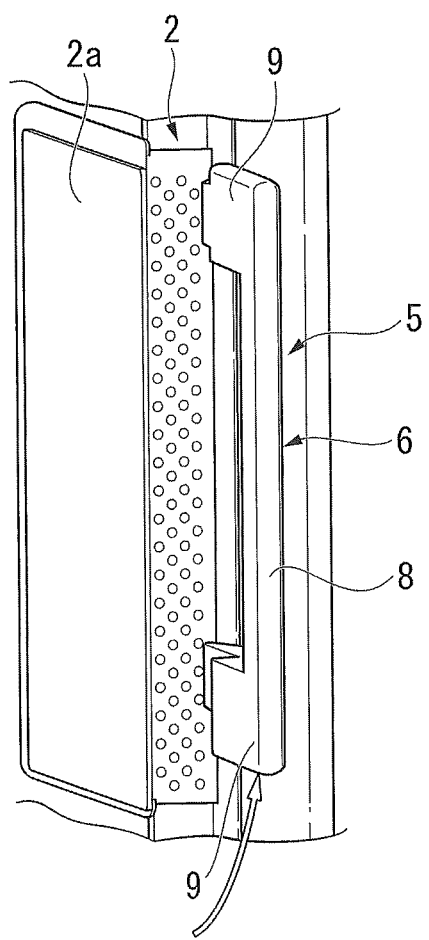
FIG. 6 is a diagram showing a state in which the handle is attached using the second fixing mechanism.
Figure 7:
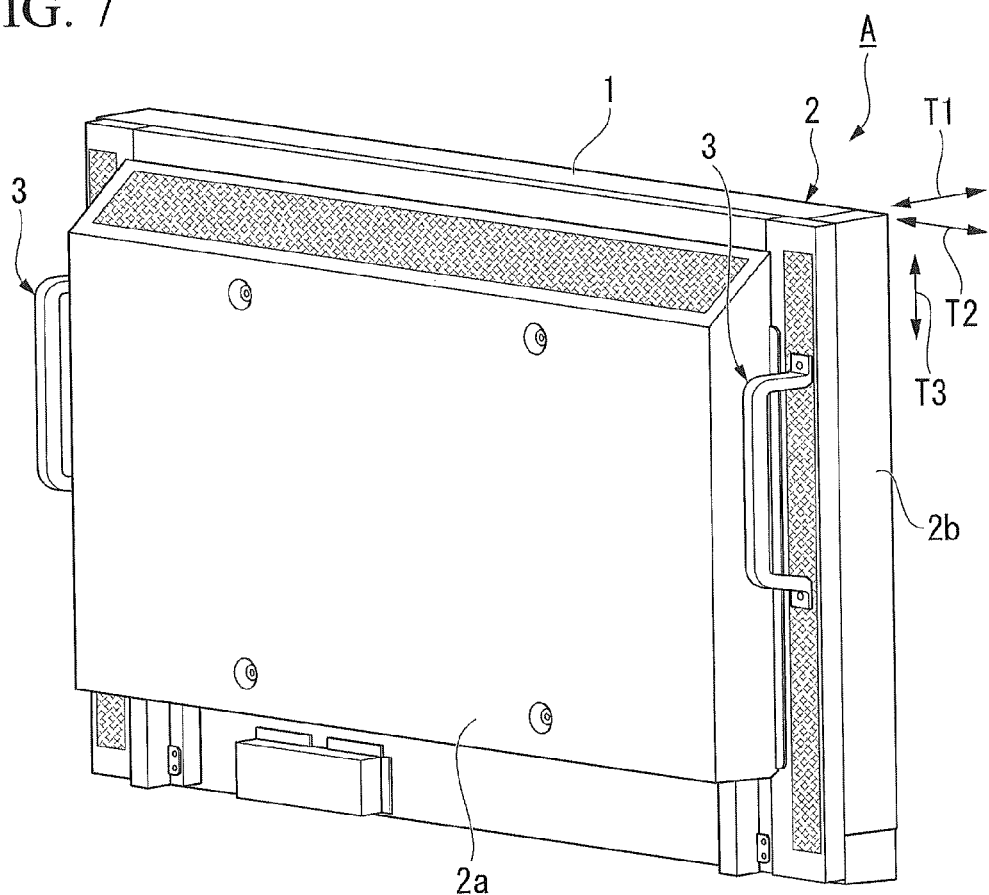
FIG. 7 is a perspective view showing a conventional display device.

Moreover, as shown in FIG. 4 and FIG. 5, the handle 5 of the present exemplary embodiment constructed as above is attached to the back surface 2a side of the display unit 2 detachably by the fixing part 7 being sandwiched and fixed between the head of a screw 20 disposed in the indented part 11 and the display unit 2, by causing the screw 20 being a fixing member, to be inserted into the first through hole 14 or the second through hole 15, to be screwed into the screw hole 21 or 22 formed in predetermined locations of the display unit 2.

At this time, in the present exemplary embodiment, as shown in FIGS. 4(a) and (b), when the screw 20 is inserted into the first through hole 14 and screwed into the screw hole 21 of the display unit 2, the first contact surface 12 that is inclined with respect to the second contact surface 13 at a predetermined angle makes surface contact with the display unit 2, and the fixing part 7 is fixed to the display unit 2. As a result, the handle body 6 protrudes outward in the depth direction T1 from the back surface 2a of the display unit 2, and the handle 5 is attached to the display unit 2 in a state in which a gap H between the handle body 6 and the display unit 2 is enlarged. Moreover, when the screw 20 is inserted into the first through hole 14 and screwed into the screw hole 21 of the display unit 2, the engaging bump 18 of the first contact surface 12 is engaged in the engaging indentation 16 of the display unit 2, and the fixing part 7 is located reliably and fixed to the display unit 2.

The first through hole 14, the first contact surface 12, the screw 20, and the screw hole 21 described above constitute a first fixing mechanism 23. When the fixing part 7 is fixed to the display unit 2 using the first fixing mechanism 23 to attach the handle 5, the gap H between the handle body 6 and the display unit 2 is enlarged, so an operator or a user can grasp the grip part 8 of the handle body 6 manually, and transport (and install) the display device B in a stable state.

Meanwhile, in the case where the display device B is installed on a wall (or in the case where display devices B are installed with their back surfaces facing each other), in a state in which the fixing part 7 is fixed to the display unit 2 using the first fixing mechanism to attach the handle 5, the handle body 6 protrudes outward in the depth direction T1 from the back surface 2a of the display unit 2. Therefore, similarly to a conventional handle 3, it is necessary to shift the location of the display device B forward from the wall surface by the amount that the handle 5 protrudes outward from the back surface 2a of the display unit 2. That is, even if the display device B is made thinner, the display device B must be installed in a state in which it stands off considerably from the wall surface.

Regarding this, in the present exemplary embodiment, when installing on a wall, the handle 5 attached using the first fixing mechanism 23 is removed from the display unit 2. Then, as shown in FIGS. 5(a) and (b), the screw 20 is inserted into the second through hole 15 and screwed into the screw hole 22 of the display unit 2, and in a state in which the second contact surface 13 makes surface contact with the display unit 2, the fixing part 7 is fixed to the display unit 2 to attach the handle 5. In this manner, when the handle 5 is attached while the second contact surface 13 makes surface contact with the display unit 2, since the second contact surface 13 is formed along the rear surface of the handle body 6, then compared with the state in which the handle 5 is attached using the first fixing mechanism 23, the handle body 6 is located on the display unit 2 side (on the back surface 2a side in the depth direction T1). As a result, the handle 5 is attached to the display unit 2 in a state in which the gap H between the handle body 6 and the display unit 2 is reduced. Furthermore, when the screw 20 is inserted into the second through hole 15 and screwed into the screw hole 22 of the display unit 2, the engaging bump 19 of the second contact surface 13 is engaged in the engaging indentation 17 of the display unit 2, and the fixing part 7 is located reliably and fixed to the display unit 2.

The second through hole 15, the second contact surface 13, the screw 20, and the screw hole 22 described above constitute a second fixing mechanism 24. When the fixing part 7 is fixed to the display unit 2 using the second fixing mechanism 24 to attach the handle 5, the gap H between the handle body 6 and the display unit 2 is reduced. Therefore when the handle 5 is installed using the second fixing mechanism 24, if the handle 5 (step part 10 and the like) is formed such that the gap H between the handle body 6 and the display unit 2 is for example approximately 30 mm, an operator or a user can hook his or her fingers in the finger hold part 9 of the handle body 6 to install (or transport) the display device B.

Moreover, at this time, the width dimension L1 of the finger hold part 9 is larger than the width dimension L3 of the fixing part 7, and the side part 9d side on the outer side of the finger hold part 9 protrudes beyond the other side part 7c of the fixing part 7 in the vertical direction T3. As a result, the gap H between the finger hold part 9 and the display unit 2 is reduced, so even if fingers cannot be inserted into this gap H, they can be hooked in the protruding part of the finger hold part 9 reliably, so that installation of the display device B can be performed in a stable state.

When the handle 5 is attached to the display unit 2 using the second fixing mechanism 24 in this manner, the handle 5 does not protrude outward in the depth direction T1 from the back surface 2a of the display unit 2. Therefore the display device B can be installed in a state with the back surface 2a close to a wall surface.

Accordingly, in the display device of the present exemplary embodiment, when the fixing part 7 is fixed to the display unit 2 using the first fixing mechanism 23, the handle 5 can be attached to the display unit 2 in a state in which the handle body 6 that an operator or a user grasps manually when the display device B is transported and installed, protrudes outward in the depth direction T3 from the back surface 2a of the display unit 2, and the gap H between the handle body 6 and the display unit 2 is enlarged. Moreover, when the fixing part 7 is fixed to the display unit 2 using the second fixing mechanism 24, the handle 5 can be attached to the display unit 2 in a state in which the gap H between the handle body 6 and the display unit 2 is reduced. That is, using the first fixing mechanism 23 and the second fixing mechanism 24, the location of the handle body 6 and the size of the gap H between the handle body 6 and the display unit 2 can be adjusted selectively.

Therefore, for example when transporting the display device B, by fixing the handle 5 to the display unit 2 using the first fixing mechanism 23, an operator or a user can manually grasp the handle body 6 firmly.

Furthermore, when installing the display device B on a wall, or when installing display devices B with their back surfaces facing each other, by fixing the handle 5 to the display unit 2 using the second fixing mechanism 24, the handle body 6 does not protrude outward in the depth direction T1 from the back surface 2a of the display unit 2, so that it is not necessary to shift the location of the display device B due to the handle 5 protruding from the back surface 2a as is done conventionally. As a result, it is possible to solve inconveniences such as installing the display device B in a state in which it stands off considerably from a wall, or creating a large gap between display devices B installed with their back surfaces facing each other even though the display device B is made thinner. Furthermore, when installing the display device B on a wall, or installing display devices B with their back surfaces facing each other, by using the second fixing mechanism 24 it is possible to ensure that there is a small gap H for an operator or user to hook his or her fingers between the handle body 6 and the display unit 2, so he or she can transport or install the display device B in a stable state with his or her fingers hooked in the handle 5.

Furthermore, in the display device B of the present exemplary embodiment, by inserting the fixing member 20 such as a screw into the first through hole 14 and fixing the fixing part 7 to the display unit 2, the first contact surface 12 makes surface contact with the display unit 2, so that the handle 5 can be located and fixed reliably using the first fixing mechanism 23 in a state in which the gap H is enlarged. Moreover, by inserting the fixing member 20 into the second through hole 15 and fixing the fixing part 7 to the display unit 2, the second contact surface 13 makes surface contact with the display unit 2, so that the handle 5 can be located and fixed reliably using the second fixing mechanism 24 in a state in which the gap H is reduced.

Furthermore, in the display device B of the present exemplary embodiment, in a state in which the first contact surface 12 or the second contact surface 13 makes surface contact with the display unit 2, by the engaging bumps 18 and 19 provided on the first contact surface 12 or the second contact surface 13 being engaged in the engaging indentations 16 and 17 of the display unit 2, it is possible to locate and fix the handle 5 reliably in a state in which the gap H is enlarged using the first fixing mechanism 23, or in a state in which the gap H is reduced using the second fixing mechanism 24.

Moreover, in the display device B of the present exemplary embodiment, the first through holes 14 and the second through holes 15 are formed such that their axes O1 are parallel to each other, and are perpendicular to the second contact surface 13. Furthermore, the first through hole (one of the through holes) 14 which opens to the first contact surface (one of the contact surfaces) 12 that is not perpendicular to the axis O1, is formed as an elongated hole. If constructed in this manner, then as shown in FIG. 4(b), when the fixing part 7 is fixed to the display unit 2 while the first contact surface 12 makes surface contact with the display unit 2, it is possible to create a state in which a central axis O2 of a fixing member 20 inserted into the first through hole 14 with the elongated hole does not coincide with the axis O1 of the first through hole 14, so that the fixing part 7 can be fixed to the display unit 2 in a state in which the central axis O2 of the fixing member 20 is perpendicular to the first contact surface 12. As a result, it is possible to fix the fixing part 7 to the display unit 2 using the fixing member 20, with the first contact surface 12 making reliable and firm surface contact with the display unit 2.

Furthermore, if the first through hole 14 and the second through hole 15 are provided with their axes O1 parallel to each other, then when forming the handle 5 using an injection molding process or a casting method, a protrusion of a metal mold for forming the first through hole 14 and a protrusion of a metal mold for forming the second through hole 15 protrude in the same direction. Therefore, by providing the protrusions in a single metal mold, and withdrawing the metal mold in one direction of the axis O1 of the first through hole 14 and the second through hole 15 when demolding, the first through hole 14 and the second through hole 15 can be formed at the same time. As a result, it is possible to manufacture the handle 5 efficiently, and reduce the cost of the metal mold, enabling the manufacturing cost of the handle 5 to be reduced.

As above, one exemplary embodiment of a display device of the present exemplary embodiment is described. However, the present invention is not limited to the above-described exemplary embodiment, and appropriate changes are possible provided they do not depart from the scope of the invention.

For example, in the present exemplary embodiment, the first through hole 14 and the second through hole 15 are formed such that their axes O1 are parallel to each other, and the first through hole 14 which is formed perpendicular to the second contact surface 13 and opens to the first contact surface 12 that is not perpendicular to the axis O1, is formed as an elongated hole. Regarding this, the arrangement may be such that the first through hole 14 and the second through hole 15 are formed such that their axes O1 are parallel to each other, and the second through hole 15 which is formed perpendicular to the first contact surface 12 and opens to the second contact surface 13 that is not perpendicular to the axis O1, is formed as an elongated hole. In this case also, it is possible to obtain the same operational effects as the present exemplary embodiment.

INDUSTRIAL APPLICABILITY

The present invention provides a display device that, by enabling a gap between a handle and a display unit to be adjusted selectively, can solve inconveniences such as the display device protruding considerably from a wall, and increasing the thickness of display devices installed with their back surfaces facing each other, even though the display device is made thinner.

REFERENCE SYMBOLS

1 Frame case
2 Display unit
2a Back surface
3 Conventional handle
5 Handle
6 Handle body
7 Fixing part
7a Proximal end
7b One side part
7c Other side part
7d Top surface
7e Back surface
7f Distal end
8 Grip part
8a Upper end
8b Lower end
9 Finger hold part
9a Distal end
9b Back surface
9c Inner side part
9d Outer side part
9e Top surface
10 Step part
11 Indented part
12 First contact surface
13 Second contact surface
14 First through hole (elongated hole, one through hole)
15 Second through hole
16 Engaging indentation
17 Engaging indentation
18 Engaging bump
19 Engaging bump
20 Screw (fixing member)
21 Screw hole
22 Screw hole
23 First fixing mechanism
24 Second fixing mechanism
A Conventional display device
B Display device
H Gap
O1 Axis
O2 Central axis
T1 Depth direction
T2 Widthwise direction
T3 Vertical direction
T4 Horizontal direction

The invention claimed is:

1. A display device comprising:
a display unit that displays an image; and
a handle provided on a back surface of the display unit, the handle including:
a handle body that is manually grasped; and
a fixing part that is detachably fixed to a back surface of the display unit, the fixing part including:
a first fixing mechanism that fixes the handle in a state in which the handle body protrudes outward in a depth direction from the back surface of the display unit, and a gap between the handle body and the display unit in the depth direction is enlarged; and
a second fixing mechanism that fixes the handle in a state in which the gap between the handle body and the display unit in the depth direction is reduced relative to a state of the handle being fixed using the first fixing mechanism, wherein
the first fixing mechanism includes:
a first contact surface that makes surface contact with the display unit, and locates the handle in a state in which the gap is enlarged;
a first through hole that opens to the first contact surface; and
a fixing member that is inserted into the first through hole, the fixing member fixing the fixing part to the display unit while causing the first contact surface making surface contact, and
the second fixing mechanism includes:
a second contact surface that intersects with the first contact surface at a predetermined angle, the second contacting surface making surface contact with the display unit, the second contact surface locating the handle in a state in which the gap is reduced;
a second through hole that opens to the second contact surface; and
a fixing member that is inserted into the second through hole, the fixing member fixing the fixing part to the display unit while causing the second contact surface making surface contact.

2. The display device according to claim 1, wherein an engaging bump is provided on each of the first contact surface and the second contact surface, the engaging bump engaging with an engaging indentation provided in the display unit to locate the fixing part, in a state of the first or second contact surface making surface contact with the display unit.

3. The display device according to claim 1, wherein an axis of the first through hole is parallel to an axis of the second through hole, and the axes of the first and second through holes are perpendicular to the first contact surface and are not perpendicular to the second contact surface, and the second through hole is an elongated hole.

4. The display device according to claim 1, wherein an axis of the first through hole is parallel to an axis of the second through hole, and the axes of the first and second through holes are not perpendicular to the first contact surface and are perpendicular to the second contact surface, and the first through hole is an elongated hole.

5. The display device according to claim 1, wherein the handle body includes:
   a grip part having an upper end and a lower end;
   a first finger hold part that extends from the upper end of the grip part to a distal end of the first finger hold part;
   a second finger hold part that extends from the lower end of the grip part to a distal end of the second finger hold part;
   a first step part that forms approximately a right angle with the first finger hold part, the first step part extending from the distal end of the first finger hold part toward a back surface side of the first finger hold part; and
   a second step part that forms approximately a right angle with the second finger hold part, the second step part extending from the distal end of the second finger hold part toward a back surface side of the second finger hold part, and
   wherein the fixing part includes:
   a first fixing part joined to the first hold part via the first step part; and
   a second first fixing part joined to the second hold part via the second step part.

6. The display device according to claim 5, wherein the back surface of the first finger hold part faces the back surface of the display unit, and
   wherein the back surface of the second finger hold part faces the back surface of the display unit.

7. The display device according to claim 1, wherein the fixing part has a back surface, and
   wherein the back surface of the fixing part has the first contact surface and the second contact surface.

8. The display device according to claim 7, wherein the back surface of the fixing part faces the back surface of the display unit.

9. The display device according to claim 7, wherein the first contact surface is joined to the second surface and is provided on a distal end side of the fixing part.

10. The display device according to claim 9, wherein the first contact surface gradually approaches a top surface of the fixing part toward the distal end side of the fixing part.

11. The display device according to claim 10, wherein the back surface of the fixing part is opposite with the top surface of the fixing part.

12. The display device according to claim 1, wherein the handle body is formed in a U-shape and includes:
    a grip part having an upper end and a lower end;
    a first finger hold part that extends from the upper end of the grip part to a distal end of the first finger hold part; and
    a second finger hold part that extends from the lower end of the grip part to a distal end of the second finger hold part.

13. The display device according to claim 12, wherein a back surface of the first finger hold part faces the back surface of the display unit, and
    wherein a back surface of the second finger hold part faces the back surface of the display unit.

14. The display device according to claim 5, wherein the first finger hold part and the second finger hold part are formed such that a width dimension in a vertical direction is larger than a width dimension of the grip part in the horizontal direction.

15. The display device according to claim 12, wherein the first finger hold part and the second finger hold part are formed such that a width dimension in a vertical direction is larger than a width dimension of the grip part in the horizontal direction.

16. The display device according to claim 5, wherein the fixing part has a width dimension in a vertical direction that is smaller than a width dimension in the vertical direction of the finger hold part.

17. The display device according to claim 5, wherein a side part side of an outer side of the first finger hold part protrudes beyond another side part of the fixing part in a vertical direction.

* * * * *